United States Patent
Liao et al.

(10) Patent No.: US 7,631,250 B2
(45) Date of Patent: Dec. 8, 2009

(54) METHOD AND APPARATUS FOR SELF-COMPENSATION ON BELIEF-PROPAGATION ALGORITHM

(75) Inventors: Yen-Chin Liao, Taipei (TW); Chien-Ching Lin, Shueishang Township Chiayi County (TW); Hsie-Chia Chang, Hsinchu (TW); Chih-Wei Liu, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 613 days.

(21) Appl. No.: 11/492,579

(22) Filed: Jul. 25, 2006

(65) Prior Publication Data

US 2007/0283213 A1     Dec. 6, 2007

(30) Foreign Application Priority Data

May 19, 2006   (TW) ............................... 95117771 A (51) Int. Cl.
*G06F 11/00*    (2006.01)
(52) U.S. Cl. .................................................... 714/800
(58) Field of Classification Search ................. 714/786, 714/795, 800–801
See application file for complete search history.

(56) References Cited

U.S. PATENT DOCUMENTS 6,829,308 B2   12/2004   Eroz et al. .................. 372/271
6,938,196 B2   8/2005    Richardson et al. .......... 714/758
7,246,297 B2 * 7/2007    Zarrinkhat et al. .......... 714/755
2004/0243917 A1   12/2004   Suh et al. ..................... 714/755

OTHER PUBLICATIONS

J. Hagenauer, E. Offer and L. Papke, "Iterative decoding of binary block and convolutional codes", IEEE Transaction on Information Theory, vol. 42, No. 2, pp. 429-445, Mar. 1996.
J. Chen and M.P.C. Fossorier, "Near optimum universal belief propogation based decoding of low-density parity check codes", IEEE Transaction on Communications, vol. 50, No. 3, pp. 406-414, Mar. 2002.
J. Heo and K. M. Chugg, "Optimization of scaling soft information in iterative decoding via density evolution methods", IEEE Transaction on Communications vol. 50, No. 6, pp. 957-961, Jun. 2005.

* cited by examiner

*Primary Examiner*—Shelly A Chase
(74) *Attorney, Agent, or Firm*—Bucknam and Archer (57) ABSTRACT

A self-compensation method includes: firstly using a min-sum algorithm to derive multiple output values in order to approach a operational result of the checking side of a belief-propagation; and then checking the present iteration number of decoding based on a checking rule; and finally, if in the previous step the present iteration number is identified with a to-be-corrected state, then performing a compensation procedure on the multiple output values, wherein the compensation term is dynamically selected in accordance with an input value of the checking nodes of the belief-propagation. The invention also provides an automatic compensation apparatus, which consists of devices such as a min-sum operating unit, and a dynamic quantization control unit, etc., which can be used, while executing the invented method described above, to decode the belief-propagation algorithm.

12 Claims, 6 Drawing Sheets

(PRIOR ART)

METHOD AND APPARATUS FOR SELF-COMPENSATION ON BELIEF-PROPAGATION ALGORITHM

FIELD OF THE INVENTION

The present invention relates to a method and apparatus for self-compensation and in particular relates to a method and apparatus for self-compensation for the decoding of the belief-propagation algorithm.

BACKGROUND OF THE INVENTION AND PRIOR ART

Recently, in the high speed transmission system, because of the usage of high performance forward error correcting technique such as low density parity code (LDPC), therefore transmission efficiency can be greatly enhanced. For LDPC (which will be referred to as LPDC decoder below), the decoding of the belief-propagation algorithm is used and is accomplished by interchanging and updating information between bit nodes and check nodes; however, the need of the nonlinear operation in updating the information of the check nodes will increase the hardware complexity and the cost. Hence, based on the economic consideration, usually a method with lower hardware complexity is used to substitute the higher complexity one. A well known method is the min-sum algorithm which is appropriate for the transmission environment with a higher SNR (signal-to-noise ratio). However, if the SNR is relatively low, then the approximation error will appear to be larger, which, in turn, will result in the reduction of the efficiency of error correction.

Figure 1:
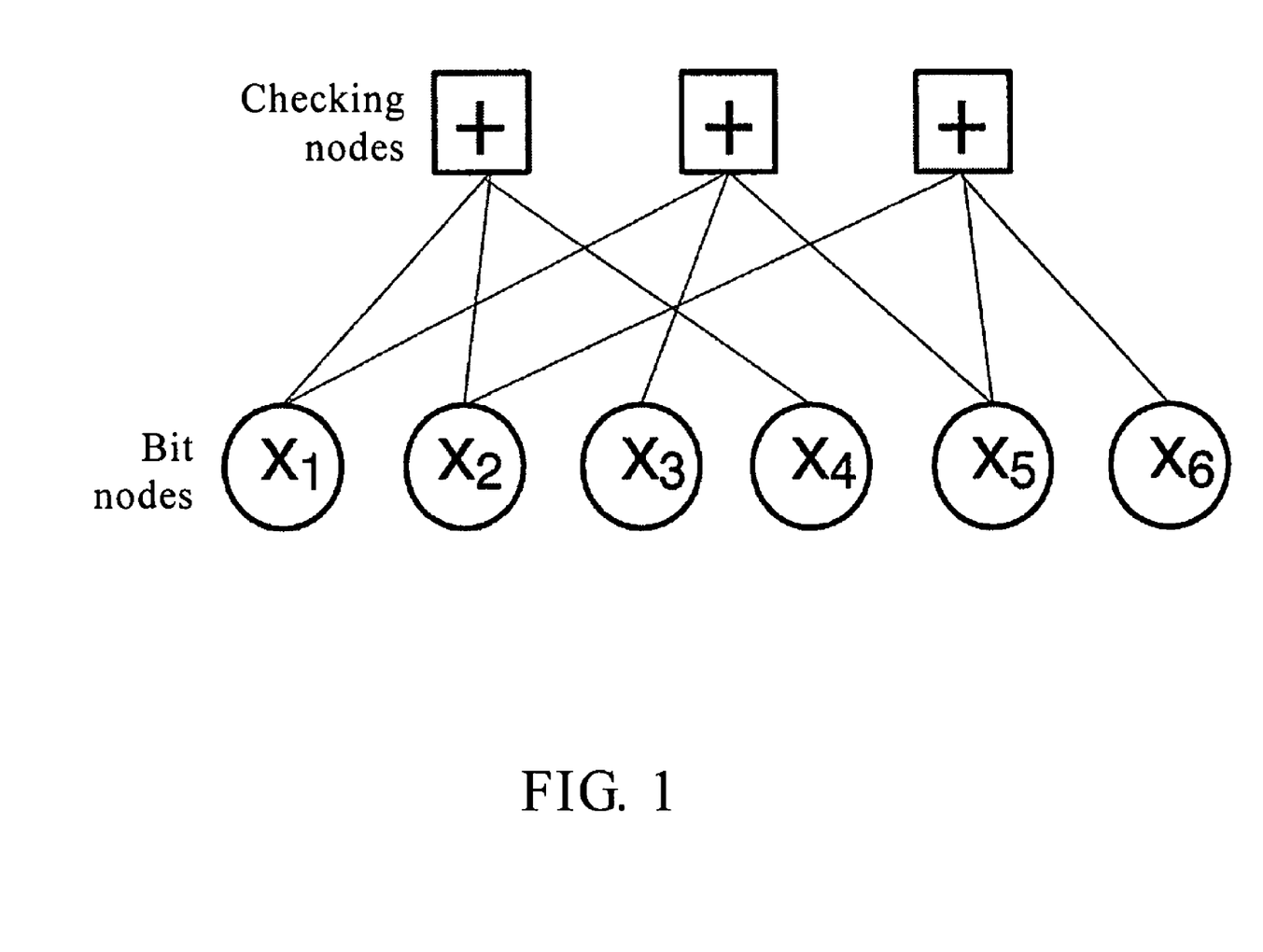
FIG. 1 shows a LPDC decoder diagram.
Figure 2:
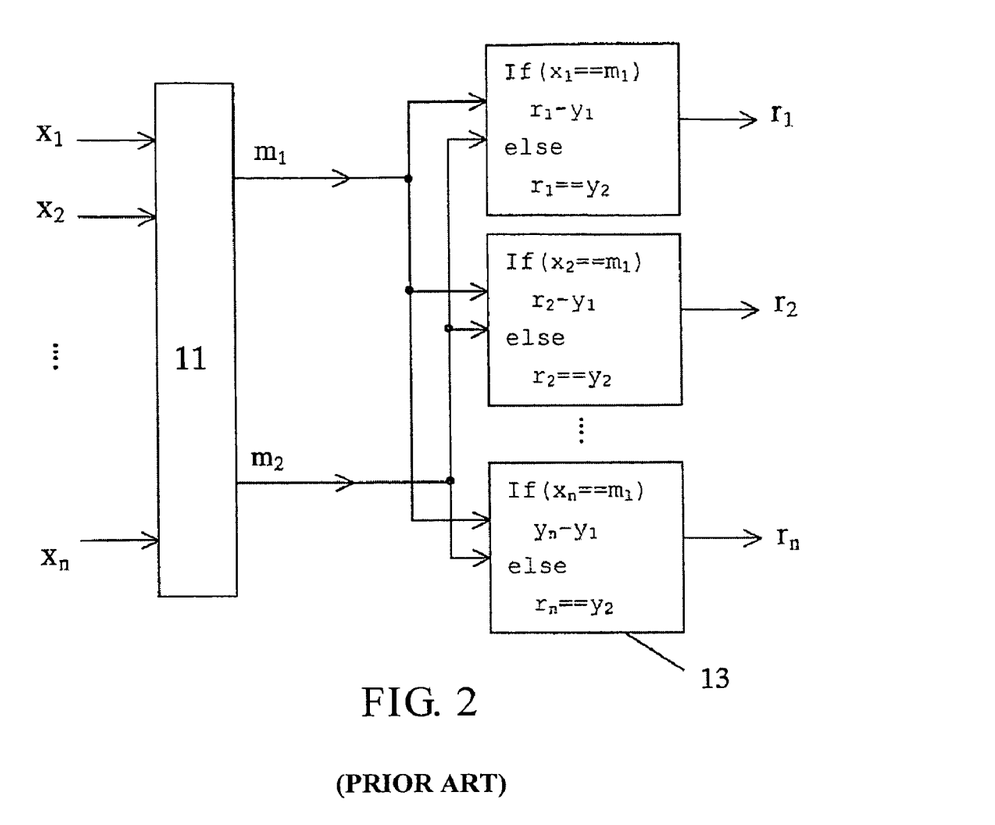
FIG. 2 shows a circuit block diagram of the check node of the decoding device according to the prior art.

FIG. 1 shows an LPDC decoder diagram. The belief-propagation algorithm used in a LPDC decoder consists of continuously information exchanges between checking nodes and bit nodes. FIG. 2 shows a circuit block diagram of the checking node of the decoding device according to the prior art. The means for min-sum operation consists of a sorter 11 and an output selector 13, in which the sorter 11, after sorting the input values $X_1 \sim X_n$ from the bit nodes, outputs the two minimum values $m_1$ and $m_2$; and directly output the results $r_1 \sim r_n$ via the output selector 13 without the provision of any compensation effect. Such an uncompensated configuration usually results in the reduction of the decoding performance. Additionally, although usually prior art techniques use a fixed constant to serve as a compensation term for the modification of the min-sum algorithm, it is still not enough for the provision of precise compensation effect.

SUMMARY OF THE INVENTION

In view of the existing problem of the prior art techniques, the object of the present invention is to provide a self-compensation method for the decoding of the belief-propagation algorithm, which can effectively correct the errors, improve the performance of the decoder, and maintain a low hardware complexity.

Still another object of the present invention is to provide a self-compensation apparatus for the decoding of the belief-propagation algorithm, which can effectively correct the errors, improve the performance of the decoder as well as maintain a low hardware complexity, and is mainly by using a min-sum algorithm to approach the operation result of a check node of a belief-propagation.

In order to accomplish the objects described above, in the present invention, the proposed self-compensation method for the decoding of the belief propagation algorithm consists of the following steps: (1) uses a min-sum algorithm to derive multiple output values in order to approach the operation result of check nodes of a belief-propagation; (2) check the present number of iterations of decoding in accordance with a checking rule; and (3), if in Step (2) the present number of iterations of decoding is identified with a to-be-corrected state, then performs a compensation procedure for the multiple output values, where the compensation term is dynamically selected in accordance with an input value of the check nodes of the belief-propagation, and the outputs of the check node all have their respective compensation terms, and the check node has at least two outputs.

Moreover, the min-sum algorithm can derive at least two output values having their respective compensation terms, in which the compensation terms are power series.

Moreover, the present invention also proposes a self-compensation apparatus for the decoding of the belief-propagation algorithm, where the self-compensation apparatus is operated by using the self-compensation method for the decoding of the belief-propagation.

The present invention, because the use of, when updating the check code of the min-sum algorithm, dynamically modifying the min-sum algorithm in accordance with the input signal of the check node at that time, the error can be effectively corrected, even when SNR of the signal is relatively low, improving the performance of the decoder, and maintaining low hardware complexity.

BRIEF DESCRIPTION OF THE DRAWINGS

Preferred embodiments of the present invention are subsequently described by referring to the enclosing drawings, wherein.

| 11, 31, 41 | sorters |
| 13, 33, 43 | output selectors |
| 32, 42 | dynamic normalization control units |
| 201 | using a min-sum algorithm |
| 203 | checking present iteration number |
| 205 | compensation |
| 321, 322 | program units |

DETAILED DESCRIPTION OF THE PREFERRED EMBODIMENTS

In order that the said and other objects, characteristics, and advantages of the present invention can be easily and obviously understood, preferred embodiments of the present invention are subsequently described by referring to the enclosing drawings.

The present invention proposes a self-compensation method that uses a dynamic compensation term in substitution for the fixed compensation term in order to improve the performance for using a fixed constant as a compensation term so that the decoder can still work properly in a lower SNR environment or the decoder may accomplish the decoding with a less decoding number in a fixed SNR environment, in which the compensation term is a power series. In the present embodiment, in order to maintain a low complexity design, a power series of base 2 is used to construct the dynamic compensation term so that the multiplication operation can be done by using additions and bits shift; however, the power series is not limited to a power series of base 2.

Additionally, determine whether the correction is necessary in accordance with the present iteration number to prevent the condition, because the value of the correction term is constrained to a power series of base 2, in which the accumulated error diverges as the decoding number increases.

Figure 3:
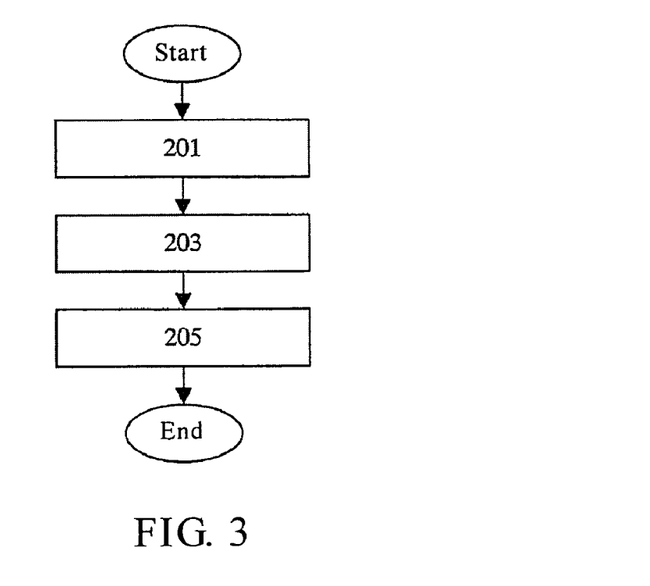
FIG. 3 is a flowchart of a preferred embodiment of the present invention showing a self-compensation method for the decoding of the belief-propagation algorithm.

FIG. 3 is a flowchart of a preferred embodiment of the present invention showing a self-compensation method for the decoding of the belief-propagation algorithm. Firstly, in step 201, make use of a min-sum algorithm to derive two output values, $m_1$ (the minimum value), $m_2$ (the second minimum value), and the output results approach the operation results of a check node of a belief-propagation. Next, in step 203, determine whether the present decoding iteration number i need to be corrected in accordance with a checking rule; and next, in step 205, if the present decoding iteration number i is determined as a to-be-corrected state, then multiply the output value m of the present sorter 31 by a compensation term B so as to improve the decoding efficiency, in which the compensation term is dynamically selected in accordance with a input value of the checking node of the belief-propagation.

For the checking rule in step 203, the checking can be performed by dividing the present decoding iteration number i by a non-zero positive integer L to obtain a remainder; and if the remainder is not equal to L−1, then determine the present decoding iteration number i as a to-be-corrected state.

Then, taking the minimum value $m_1$ as an example, the dynamic adjustment in step 205 comprises:

(1) if the present decoding iteration number i is identified with a to-be-corrected state, then compare the output value $m_1$ of the present sorter 31 with a comparison value $T_1$;

(2) if the output value $m_1$ of the present sorter 31 is larger then the comparison value $T_1$, then multiply the output value $m_1$ of the present sorter 31 by a first compensation value $B_{11}$ of a first compensation term; if the output value $m_1$ of the present sorter 31 is no larger then the comparison value $T_1$, then multiply the output value $m_1$ of the present sorter 31 by a second compensation value $B_{12}$ of a first compensation term.

Additionally, for the self-compensation apparatus in the present invention, the number of the output of the sorter 31 may be two or more $(m_1 \sim m_n)$; however, in the present embodiment, to serve as an illustrating example, the number of output is two $(m_1, m_2)$ having their first, second compensation terms $B_1$, $B_2$, respectively.

Figure 4:
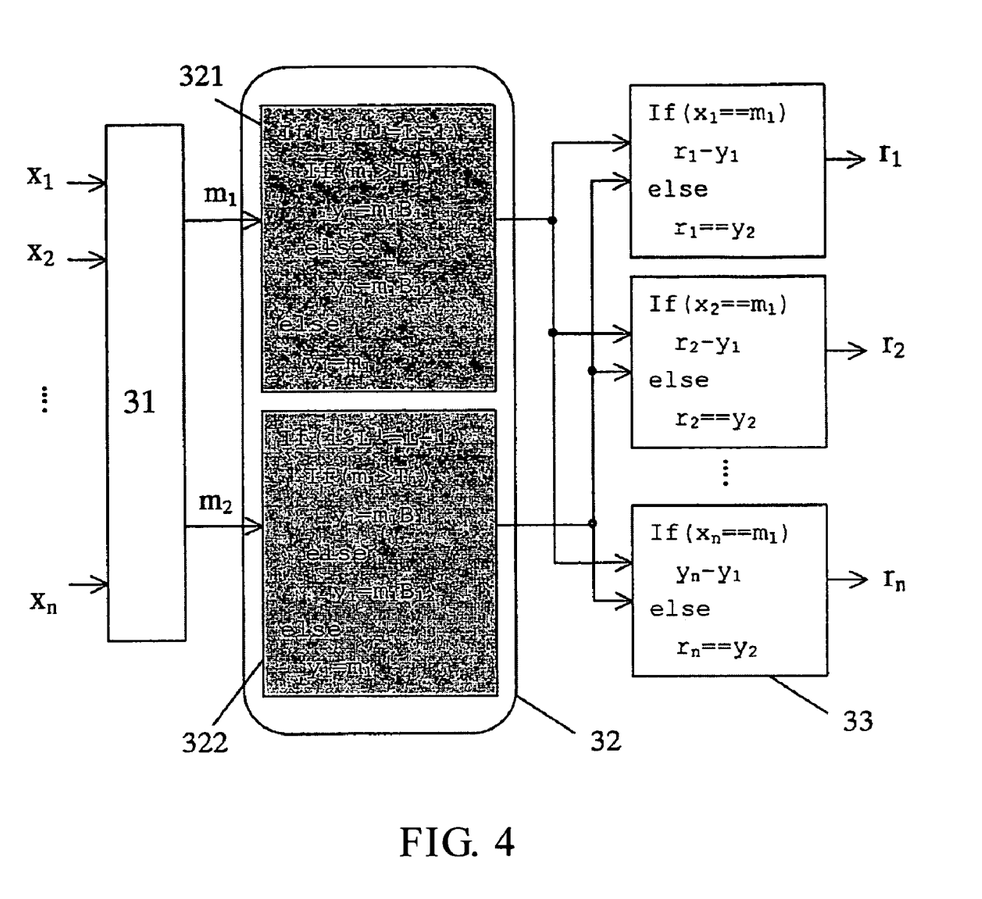
FIG. 4 is a circuit block diagram of the check node for a preferred embodiment of the present invention showing a self-compensation method for the decoding of the belief-propagation algorithm.

FIG. 4 is a circuit block diagram of the check node for a preferred embodiment of the present invention showing a self-compensation method for the decoding of the belief-propagation algorithm. Two minimum values $m_1$ and $m_2$ are selected, via the sorter 31, from the input values $X_1 \sim X_n$ that are coming from the bit nodes. The dynamic normalization control unit 32 comprises a program unit 321 and a program unit 322. Then program units 321 and 322 receive the minimum values $m_1$ and $m_2$, respectively, and then output the compensated values $y_1$ and $y_2$, and furthermore output the results $r_1 \sim r_n$ via the output selector 33.

In contrast to FIG. 2 which shows a circuit block diagram of the checking node according to the prior art, the checking node circuit of the present invention has added a dynamic normalization control unit 32 in between the sorter 31 and the output selector 33 which combine to serve as a means for the min-sum operation. For the dynamic normalization control unit 32 shown in FIG. 4, in the following the present embodiment of a self-compensation method (steps 203, 205) for the decoding of the belief-propagation algorithm is expressed in terms of computer program. First of all, by using the sorter 31, find the two minimum values $m_1$ and $m_2$ from the input values $X_1 \sim X_n$, and then execute the following program by means of the dynamic normalization control unit:

```
    If (i%L != L−1)                (Program 1)
        If (m₁ > T₁)
            y₁ = m₁B₁₁
        else
            y₁ = m₁B₁₂
    else
        y₁ = m₁
; and
    If (i%L != L−1)                (Program 1)
        If (m₂ > T₂)
            y₂ = m₂B₂₁
        else
            y₂ = m₂B₂₂
    else
        y₂ = m₂
```

In Program 1 and Program 2, L is a non-zero positive integer, i is the present decoding iteration number, $B_{11}$, $B_{12}$, $B_{21}$, and $B_{22}$ are the first, second compensation values of the first, second compensation terms, respectively, $y_1$, $y_2$ are the compensated output values, $T_1$ and $T_2$ are the comparison values. The suggested values for many different kinds of 64800-bit LPDC codes of DVB-S2 system are listed in the following table:

TABLE 1

| Encoding Rate | $B_{11}$ | $B_{12}$ | $T_1$ | $B_{21}$ | $B_{22}$ | $T_2$ |
|---|---|---|---|---|---|---|
| 1/4 | 0.5 | 0.75 | 0.5 | 1.0 | 1.0 | ... |
| 1/3 | 0.625 | 0.75 | 0.625 | 0.875 | 1.0 | 2.0 |
| 2/5 | 0.5 | 0.75 | 1.25 | 0.75 | 1.0 | 1.25 |
| 1/2 | 0.625 | 0.875 | 1.5 | 0.75 | 0.875 | 1.625 |
| 3/5 | 0.5 | 0.75 | 2.0 | 0.75 | 1.0 | 2.0 |

When L>1, the suggested values are listed in the following table:

TABLE 2

| Encoding Rate | $B_{11}$ | $B_{12}$ | $T_1$ | $B_{21}$ | $B_{22}$ | $T_2$ | L |
|---|---|---|---|---|---|---|---|
| 1/4 | 0.375 | 0.5 | 0.5 | 0.75 | 0.75 | ... | 3 |
| 1/3 | 0.625 | 0.75 | 2.0 | 0.75 | 0.875 | 1.5 | 3 |
| 2/5 | 0.5 | 0.625 | 1.5 | 0.625 | 0.875 | 1.125 | 3 |
| 1/2 | 0.5 | 0.625 | 1.75 | 0.625 | 0.75 | 2.0 | 2 |
| 3/5 | 0.375 | 0.625 | 2.0 | 0.625 | 0.75 | 1.0 | 3 |

Figure 5:
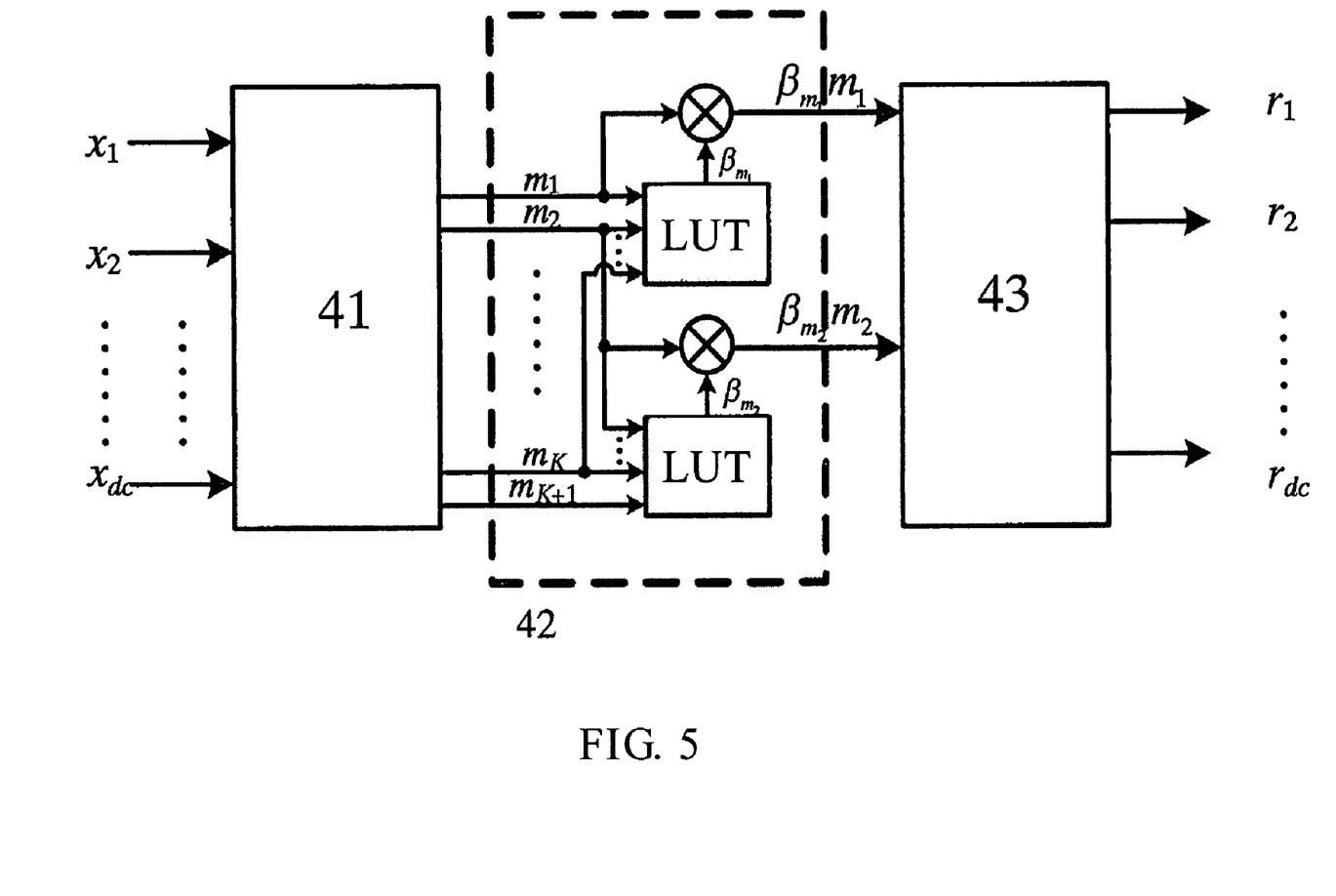
FIG. 5 shows a check node circuit block diagram for multi-dimensional input of a preferred embodiment of the present invention.

In the configuration of another embodiment of the present invention, FIG. 5 shows a checking node circuit block diagram for multi-dimensional input of a preferred embodiment of the present invention. The compensation term may not only be determined by the minimum and the second minimum values of the min-sum algorithm, but also can be determined by multi-dimensional inputs of the checking nodes. For example, the outputs $m_1$ and $m_2$ of the sorter, after being dynamically compensated, generate $B_{m1}m_1$ and $B_{m2}m_2$. $B_{m1}m_1$ and $B_{m2}m_2$ can then be separately determined by the k-dimensional sorters $(m_1 \sim m_k)$ and $(m_2 \sim m_{k+1})$. In this figure, for example, the LUT (look-up table) method is adopted as a selection method for compensation terms (normalization factor).

Figure 6:
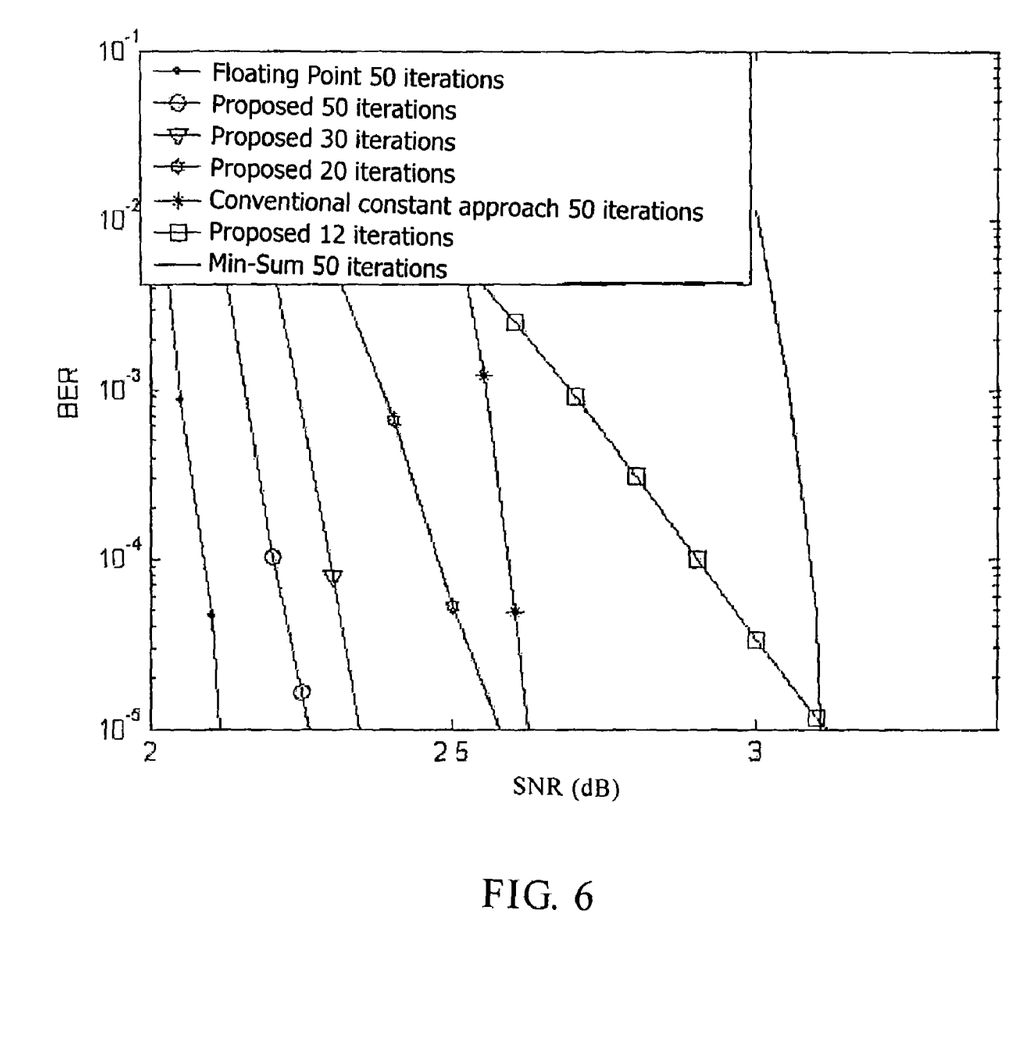
FIG. 6 shows a computer simulation result of the present embodiment.

FIG. 6 shows a computer simulation result of the present embodiment, which may explain that the dynamic compensation method proposed in the present invention can save the number of decoding and time. As shown in FIG. 6 in which SNR is the signal-to-noise ratio, a lower SNR value means higher noise energy. For example, for the rate 3/5 in the table, when SNR is approximately 3.1 dB, it is able to have a BER (Bit Error Rate) of $10^{-5}$ after 50 times of decoding by using the min-sum algorithm, while, under the same SNR assumption, the same BER can be achieved after 12 times of decoding if the dynamic compensation method proposed in the present invention is adopted. Similarly, if SNR is approximately equal to 2.6 dB, for the conventional constant approach, it takes 50 times of decoding to achieve a $10^{-5}$ bit error rate, while it takes only 12 times of decoding to achieve the very same performance if the dynamic compensation method proposed in the present invention is adopted.

Figure 7:
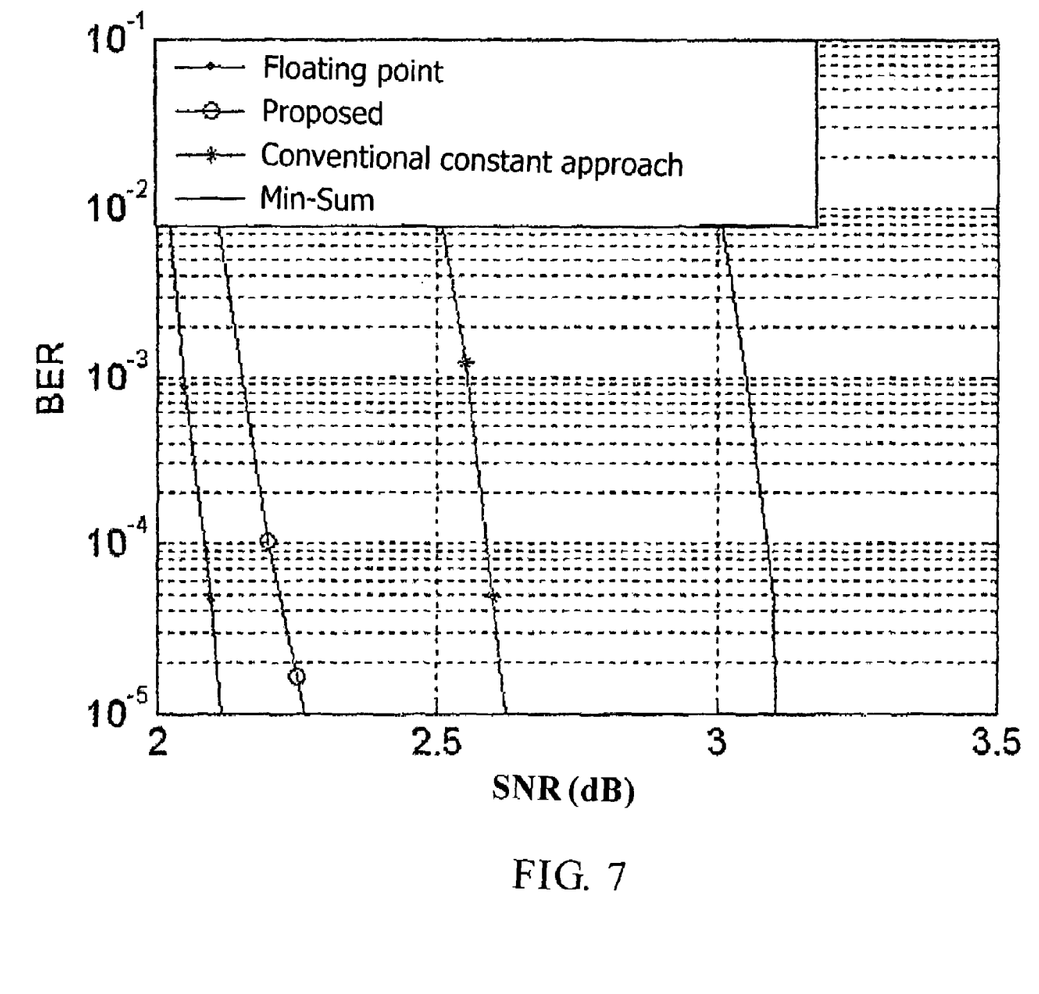
FIG. 7 shows a computer simulation result of the present embodiment.

FIG. 7 shows a computer simulation result of the present embodiment. Taking the value 3/5 as an illustrating example, assume a maximum of 50 times of execution of decoding for the decoder using different algorithms. For the min-sum algorithm, to achieve a $10^{-5}$ BER, the required SNR is approximately 3.1 dB, while the required SNR is approximately 2.3 dB, which implies a 0.8 dB improvement in SNR, if the dynamic compensation method proposed in the present invention is adopted. Similarly, in comparison with the conventional constant approach, a $10^{-5}$ BER can be achieved when SNR is approximately 2.6 dB. If the dynamic compensation method proposed in the present invention is adopted, there is approximately a 0.3 dB improvement in SNR.

To sum up, for the present invention, because, in the min-sum algorithm, the error of the min-sum algorithm is dynamically corrected in accordance with the input signal of the check node, it results in that the error can be effectively corrected, the performance of the decoder can be improved, and the hardware complexity can still remain lower.

Although the present invention is disclosed in the preferred embodiments described above, the inventive idea should not be limited only to those. The present invention can also be applied to digital television satellite broadcast, high-speed Ethernet network, high-speed wireless local area network, and wireless metropolitan network, etc. It will be understood by those skilled in the art that various other changes in the form and details may be made without departing from the spirit and scope of the present invention. It is to be understood that various changes may be made in adapting to different embodiments without departing from the broader concepts disclosed herein and comprehended by the claims that follow. Hence, it is to be understood that the protected scope of the present invention should be comprehended by those claims that are detailed in CLAIMS section of the appendix.

The invention claimed is:

1. A self-compensation method for decoding the belief-propagation algorithm, comprising the following steps:
   a first step that uses a min-sum algorithm to derive multiple output values in order to approach the operation result of check nodes of a belief-propagation.
   a second step that check the present number of iterations of decoding in accordance with a checking rule; and
   a third step that, if in the second step the present number of iterations of decoding is identified with a to-be-corrected state, then performs a compensation procedure for the multiple output values, wherein the compensation term is dynamically selected in accordance with an input value of the checking nodes of the belief-propagation.

2. Self-compensation method in accordance with claim 1, wherein the min-sum algorithm is able to derive at least two output values, where the two output values corresponding to different compensation terms.

3. Self-compensation method in accordance with claim 1, wherein the compensation term is a power series.

4. Self-compensation method in accordance with claim 1, wherein the checking rule is to divide the present number of iterations of the decoding by a non-zero positive integer so as to obtain a remainder, and, furthermore, if the remainder is not equal to the positive integer minus 1, then determine that the present number of iterations of the decoding as a to-be-corrected state.

5. Self-compensation method in accordance with claim 1, wherein the compensation procedure is to compare the present output value with a comparing value; and, if the present output value is larger than the comparing value, then multiply the present output value by a compensation value of the compensation term; and, furthermore, if the present output value is not larger than the comparing value, then multiply the present output value by another compensation value of the compensation term.

6. Self-compensation method in accordance with claim 1, wherein the compensation term may not only be determined by the minimum and the second minimum values of the min-sum algorithm, but also can be determined by multi-dimensional inputs of the checking nodes.

7. Self-compensation method in accordance with claim 1, wherein the compensation term can be implemented by means of, a look-up table, or a multiplication.

8. Self-compensation method in accordance with claim 1, wherein the method can be implemented by software, a multi-purpose processor, or a digital signal processor.

9. A self-compensation apparatus for decoding the belief-propagation algorithm, comprising:
   a min-sum operation unit, which further comprises a sorter and an output selector, that uses a min-sum algorithm to derive multiple output values in order to approach the operation result of check nodes of a belief-propagation; and
   a dynamic normalization control unit, placing in between the sorter and the output selector, which check the present number of iterations of decoding in accordance with a checking rule; and furthermore if the present number of iterations of decoding is identified with a to-be-corrected state, then per\- forms a compensation procedure for the multiple output values.

10. Self-compensation apparatus in accordance with claim 9, wherein the checking rule is to divide the present number of iterations of the decoding by a non-zero positive integer so as to obtain a remainder, and, furthermore, if the remainder is not equal to the positive integer minus 1, then determine that the present number of iterations of the decoding as a to-be-corrected state.

11. Self-compensation apparatus in accordance with claim 9, wherein the compensation procedure is to compare the present output value with a comparing value; and, if the present output value is larger than the comparing value, then multiply the present output value by a compensation value of the compensation term; and, furthermore, if the present output value is not larger than the comparing value, then multiply the present output value by another compensation value of the compensation term.

12. Self-compensation apparatus in accordance with claim 9, wherein the self-compensation apparatus can be implemented by means of a digital circuit or an analog circuit.

* * * * *

UNITED STATES PATENT AND TRADEMARK OFFICE
CERTIFICATE OF CORRECTION

| | | |
|---|---|---|
| PATENT NO. | : 7,631,250 B2 | Page 1 of 1 |
| APPLICATION NO. | : 11/492579 | |
| DATED | : December 8, 2009 | |
| INVENTOR(S) | : Liao et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 722 days.

Signed and Sealed this

Second Day of November, 2010

David J. Kappos
*Director of the United States Patent and Trademark Office*